(12) United States Patent
Putman et al.

(10) Patent No.: US 12,585,839 B2
(45) Date of Patent: Mar. 24, 2026

(54) PROCESS VARIABILITY SIMULATOR FOR MANUFACTURING PROCESSES

(71) Applicant: Nanotronics Imaging, Inc., Cuyahoga Falls, OH (US)

(72) Inventors: John B. Putman, Celebration, FL (US); Matthew C. Putman, Brooklyn, NY (US); Jonathan Lee, Brooklyn, NY (US); Sarah Constantin, Brooklyn, NY (US); Damas Limoge, Brooklyn, NY (US)

(73) Assignee: Nanotronics Imaging, Inc., Cuyahoga Falls, OH (US)

( * ) Notice: Subject to any disclaimer, the term of this patent is extended or adjusted under 35 U.S.C. 154(b) by 0 days.

(21) Appl. No.: 18/443,942

(22) Filed: Feb. 16, 2024

(65) Prior Publication Data

US 2024/0281569 A1 Aug. 22, 2024

Related U.S. Application Data

(60) Provisional application No. 63/485,616, filed on Feb. 17, 2023.

(51) Int. Cl.
G06F 7/48 (2006.01)
G06F 30/17 (2020.01)

(52) U.S. Cl.
CPC ..................................... G06F 30/17 (2020.01)

(58) Field of Classification Search
CPC ...................................................... G06F 30/17
See application file for complete search history.

(56) References Cited

U.S. PATENT DOCUMENTS

2007/0090091 A1* 4/2007 Adomaitis .............. H01L 22/12
700/121
2015/0045928 A1 2/2015 Perez et al.
(Continued)

FOREIGN PATENT DOCUMENTS

CN       113613813 A      11/2021
TW       201314474 A      4/2013
WO       2019180466       9/2019

OTHER PUBLICATIONS

International Search Report and Written Opinion for International Application No. PCT/US2024/016195, mailed May 17, 2024, 13 Pages.
(Continued)

*Primary Examiner* — Nithya J. Moll
(74) *Attorney, Agent, or Firm* — DLA Piper LLP (US)

(57) ABSTRACT

A computing system receives one or more process parameters to be optimized during a multi-step manufacturing process. The computing system initiates a process prediction model in accordance with the one or more process parameters. The computing system simulates the multi-step manufacturing process using a plurality of sets of different setpoints until the one or more process parameters are optimized. The computing system identifies a first set of setpoints from the plurality of sets of different setpoints that optimized the one or more process parameters. The computing system causes the station controller to apply the first set of setpoints to the one or more stations.

20 Claims, 4 Drawing Sheets

(56)　　　　　　References Cited

U.S. PATENT DOCUMENTS

| 2016/0012159 | A1* | 1/2016 | Ferrar | G06F 30/28 |
| | | | | 703/1 |
| 2016/0274558 | A1* | 9/2016 | Strohmenger | G06Q 10/06 |
| 2018/0341248 | A1 | 11/2018 | Mehr et al. | |
| 2019/0243338 | A1* | 8/2019 | Golway | G06F 30/20 |
| 2020/0143006 | A1 | 5/2020 | Matusik et al. | |
| 2020/0166909 | A1 | 5/2020 | Noone et al. | |
| 2021/0141970 | A1 | 5/2021 | Xu et al. | |
| 2021/0276267 | A1* | 9/2021 | Anapolsky | B33Y 10/00 |
| 2022/0027529 | A1* | 1/2022 | Zarur | G06F 30/12 |

OTHER PUBLICATIONS

Kim, et al., "A review on quality control in additive manufacturing," Rapid Prototyping Journal 24.3, 2018, pp. 645-669.
Office Action for Taiwanese Patent Application No. 113105640, mailed Nov. 18, 2024, 19 pages.
Office Action for Taiwanese Patent Application No. 113105640, mailed Sep. 9, 2025, 13 pages.

* cited by examiner

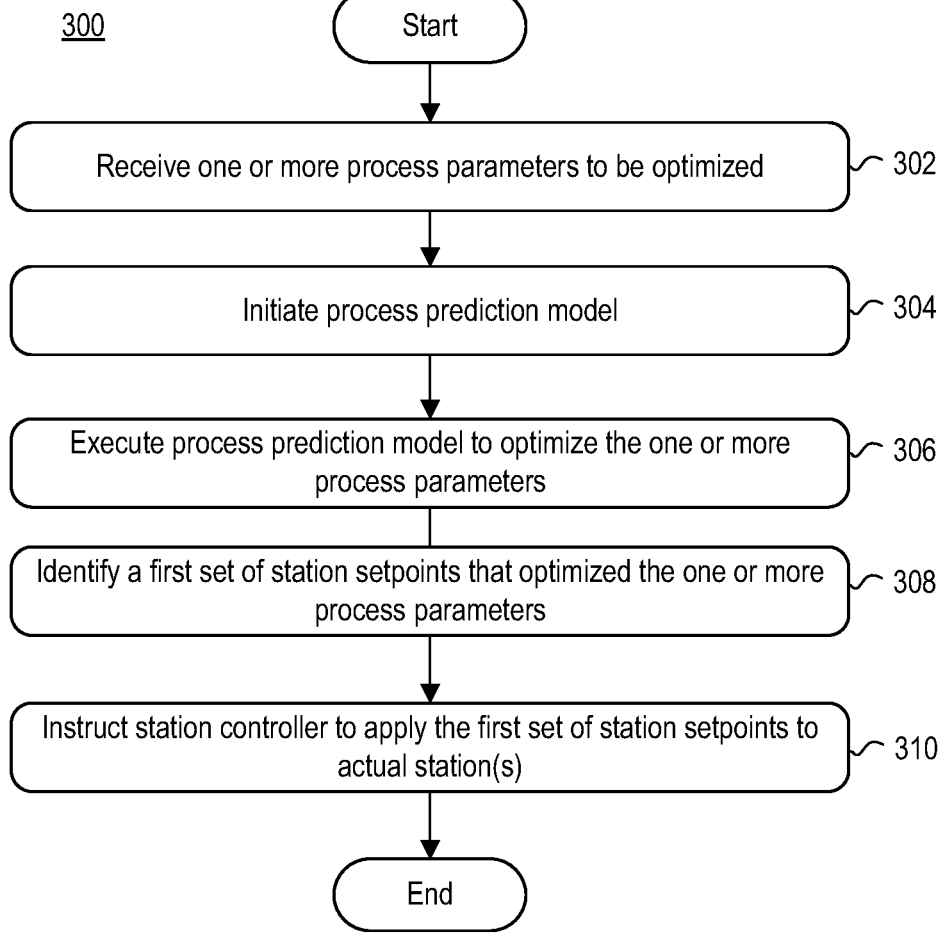

300

Start

↓

Receive one or more process parameters to be optimized ⟋ 302

↓

Initiate process prediction model ⟋ 304

↓

Execute process prediction model to optimize the one or more process parameters ⟋ 306

↓

Identify a first set of station setpoints that optimized the one or more process parameters ⟋ 308

↓

Instruct station controller to apply the first set of station setpoints to actual station(s) ⟋ 310

↓

End

FIG. 3

PROCESS VARIABILITY SIMULATOR FOR MANUFACTURING PROCESSES

CROSS-REFERENCE TO RELATED APPLICATIONS

This application claims priority to U.S. Provisional Application Ser. No. 63/485,616, filed Feb. 17, 2023, which is hereby incorporated by reference in its entirety.

FIELD OF DISCLOSURE

The present disclosure generally pertains to the field of manufacturing process control and optimization, and more specifically, to systems and methods for simulating process variability and predicting future effects of changing process parameters using deep learning models.

BACKGROUND

In the field of manufacturing process control and optimization, a variety of parameters can influence the outcome of a process. These parameters can include, but are not limited to, the temperature, pressure, and humidity of the environment, the properties of the raw materials used, and the settings of the machinery involved in the process. The parameters can vary over time due to a multitude of factors, such as changes in the raw materials or external conditions, or due to the inherent variability of the machinery and control systems used.

SUMMARY OF INVENTION

In some embodiments, a manufacturing system is disclosed herein. The manufacturing system includes one or more stations, a station controller, and a computing system. Each station is configured to perform at least one step in a multi-step manufacturing process for a product. The station controller communicates with the one or more stations. The station controller defines setpoints for each of the one or more stations. The computing system is configured to optimize process parameters in the multi-step manufacturing process. The computing system is configured to perform operations. The operations include receiving one or more process parameters to be optimized during the multi-step manufacturing process. The operations further include initiating a process prediction model in accordance with the one or more process parameters to be optimized during the multi-step manufacturing process. The operations further include simulating, using the process prediction model, the multi-step manufacturing process using a plurality of sets of different setpoints until the one or more process parameters are optimized. The operations further include identifying a first set of setpoints from the plurality of sets of different setpoints that achieved the optimized one or more process parameters. The operations further include causing the station controller to apply the first set of setpoints to the one or more stations.

In some embodiments, a method of optimizing process parameters in a multi-step manufacturing process. A computing system receives one or more process parameters to be optimized during the multi-step manufacturing process. The multi-step manufacturing process is performed in a manufacturing system that includes one or more stations and a station controller. Each station is configured to perform a step in the multi-step manufacturing process. The station controller communicates with the one or more stations. The station controller defines setpoints for each of the one or more stations. The computing system initiates a process prediction model in accordance with the one or more process parameters to be optimized during the multi-step manufacturing process. The computing system simulates, using the process prediction model, the multi-step manufacturing process using a plurality of sets of different setpoints until the one or more process parameters are optimized. The computing system identifies a first set of setpoints from the plurality of sets of different setpoints that achieved the optimized one or more process parameters. The computing system causes the station controller to apply the first set of setpoints to the one or more station.

In some embodiments, a non-transitory computer readable medium is disclosed herein. The non-transitory computer readable medium includes one or more sequences of instructions stored thereon, which, when executed by a processor, causes a computing system to perform operations. The operations include receiving, by the computing system, one or more process parameters to be optimized during a multi-step manufacturing process. The multi-step manufacturing process is performed in a manufacturing system that includes one or more stations and a station controller. Each station is configured to perform a step in the multi-step manufacturing process. The station controller communicates with the one or more stations. The station controller defines setpoints for each of the one or more stations. The operations further include initiating, by the computing system, a process prediction model in accordance with the one or more process parameters to be optimized during the multi-step manufacturing process. The operations further include simulating, by the computing system, using the process prediction model, the multi-step manufacturing process using a plurality of sets of different setpoints until the one or more process parameters are optimized. The operations further include identifying, by the computing system, a first set of setpoints from the plurality of sets of different setpoints that achieved the optimized one or more process parameters. The operations further include causing, by the computing system, the station controller to apply the first set of setpoints to the one or more stations.

BRIEF DESCRIPTION OF FIGURES

The accompanying drawings, which are incorporated herein and form part of the specification, illustrate the present disclosure and, together with the description, further serve to explain the principles of the present disclosure and to enable a person skilled in the relevant art(s) to make and use embodiments described herein.

FIG. 3 is a flowchart illustrating a method of optimizing a manufacturing process using the trained prediction model, according to example embodiments.

Figure 1:
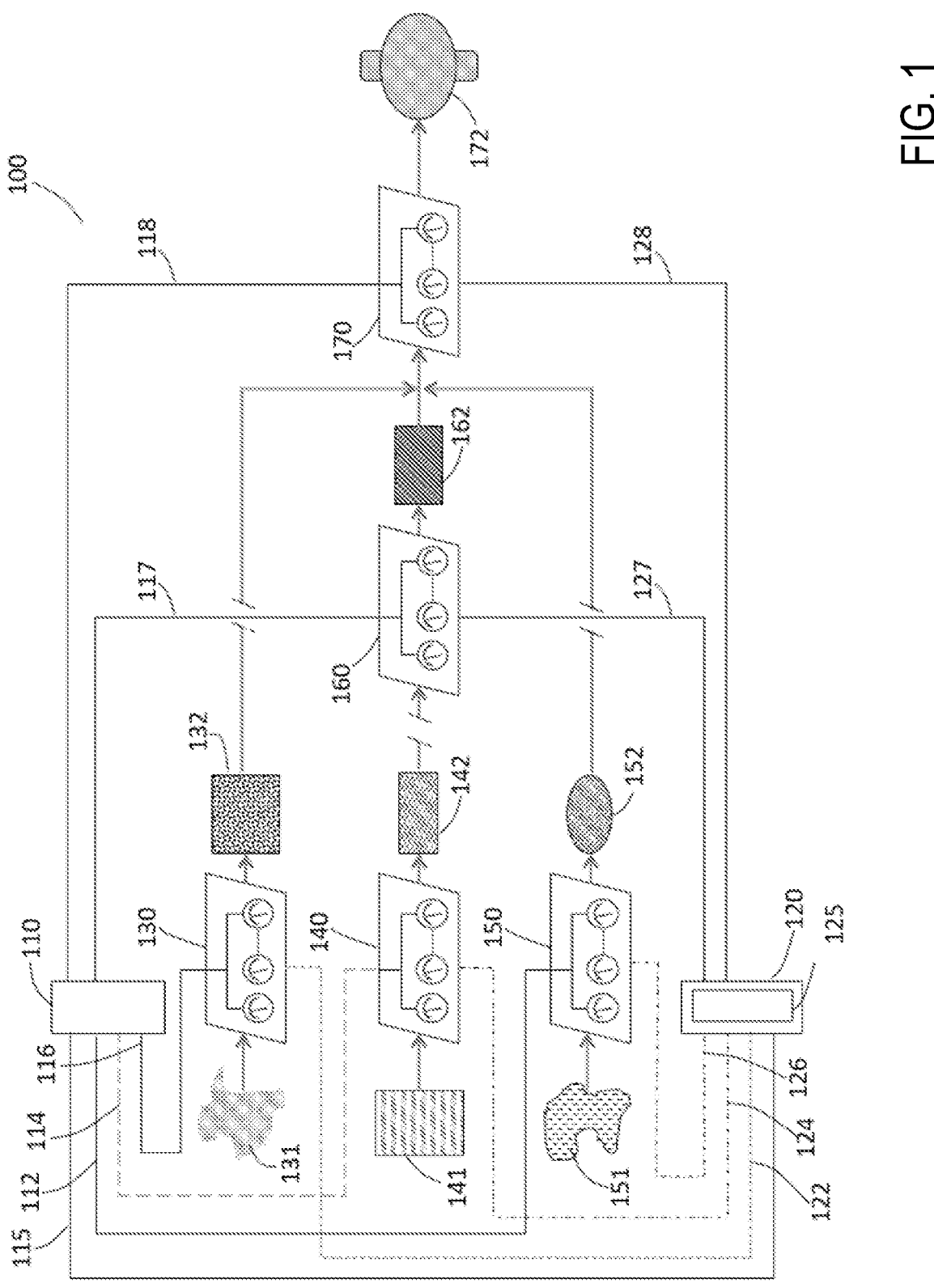
FIG. 1 is a block diagram illustrating a manufacturing environment, according to example embodiments.

The features of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

Manufacturing is complex and comprises different process stations (or "stations") that process raw materials until a final product (referred to herein as "final output") is produced. With the exception of the final process station, each process station receives an input for processing and outputs an intermediate output that is passed along to one or more subsequent (downstream) processing station for additional processing. The final process station receives an input for processing and outputs the final output.

Each process station can include one or more tools/equipment that performs a set of process steps on: received raw materials (this can apply to a first station or any of the subsequent stations in the manufacturing process) and/or the received output from a prior station (this applies to any of the subsequent stations in the manufacturing process). Examples of process stations can include, but are not limited to conveyor belts, injection molding presses, cutting machines, die stamping machines, extruders, CNC mills, grinders, assembly stations, 3D printers, robotic devices, quality control and validation stations. Example process steps can include: transporting outputs from one location to another (as performed by a conveyor belt); feeding material into an extruder, melting the material and injecting the material through a mold cavity where it cools and hardens to the configuration of the cavity (as performed by an injection molding presses); cutting material into a specific shape or length (as performed by a cutting machine); pressing material into a particular shape (as performed by a die stamping machine).

In manufacturing processes, process stations can run in parallel or in series. When operating in parallel, a single process station can send its intermediate output to more than 1 stations (e.g., 1 to N stations), and a single process station can receive and combine intermediate outputs from more than one to N stations. Moreover, a single process station can perform the same process step or different process steps, either sequentially or non-sequentially, on the received raw material or intermediate output during a single iteration of a manufacturing process.

Operation of each process station can be governed by one or more process controllers. In some implementation, each process station has one or more process controllers (referred to herein as "a station controller") that are programmed to control the operation of the process station (the programming algorithms referred to herein as "control algorithms"). In some embodiments, a single process controller may be configured to control the operations of two or more process stations. One example of a factory controller is a Programmable Logic Controller (PLC). A PLC can be programmed to operate manufacturing processes and systems. The PLC or other controller can receive information from connected sensors or input devices, process the data and generate outputs (e.g., control signals to control an associated process station) based on pre-programmed parameters and instructions.

An operator or control algorithms can provide the station controller with station controller setpoints (or "setpoints" or "controller setpoints" or CSPs) that represent a desired single value or range of values for each control value. The values that can be measured during the operation of a station's equipment or processes can either be classified as control values or station values. A value that is controlled by a station controller will be classified herein as control values; the other measured values will be classified herein as station values. Examples of control and/or station values include, but are not limited to speed, temperature, pressure, vacuum, rotation, current, voltage, power, viscosity, materials/resources used at the station, throughput rate, outage time, noxious fumes, the type of steps and order of the steps performed at the station. Although, the examples are the same, whether a measured value is classified as a control value or a station value, will depend on the particular station and whether the measured value is controlled by a station controller or is simply a byproduct of the operation of the station. During the manufacturing process, control values are provided to a station controller, while station values are not.

The control algorithms can also include instructions for monitoring control values, comparing control values to corresponding setpoints and determining what actions to take when the control value is not equal to (or not within a defined range of) a corresponding station controller setpoint. For example, if the measured present value of the temperature for the station is below the setpoint, then a signal may be sent by the station controller to increase the temperature of the heat source for the station until the present value temperature for the station equals the setpoint. Conventional process controllers used in the manufacturing process to control a station are limited, because they follow static algorithms (e.g., on/off control, PI control, PID control, Lead/Lag control) for prescribing what actions to take when a control value deviates from a setpoint.

One or more sensors can be included within or coupled to each process station. These can be physical or virtual sensors that exist in a manufacturing process unrelated to the operation of a deep learning processor, as well as any new sensors that can be added to perform any additional measurements required by deep learning processor. Sensors can be used to measure values generated by a manufacturing process such as: station values, control values, intermediate and final output values. Example sensors can include but are not limited to rotary encoders for detecting position and speed; sensors for detecting proximity, pressure, temperature, level, flow, current and voltage; limit switches for detecting states such as presence or end-of-travel limits Sensor, as used herein, includes both a sensing device and signal conditioning. For example, the sensing device reacts to the station or control values and the signal conditioner translates that reaction to a signal that can be used and interpreted by deep learning processor or the station controller. Example of sensors that react to temperature are RTDs, thermocouples and platinum resistance probes. Strain gauge sensors react to pressure, vacuum, weight, change in distance among others. Proximity sensors react to objects when they are within a certain distance of each other or a specified part. With all of these examples, the reaction must be converted to a signal that can be used by a station controller or deep learning processor. In many cases the signal conditioning function of the sensors produce a digital signal that is interpreted by the station controller. The signal conditioner can also produce an analog signal or TTL signal among others. Virtual sensors also known as soft sensors, smart sensors or estimators include system models that can receive and process data from physical sensors.

A process value, as used herein refers to a station value or control value that is aggregated or averaged across an entire series of stations (or a subset of the stations) that are part of the manufacturing process. Process values can include, for example, total throughput time, total resources used, average temperature, average speed.

In addition to station and process values, various characteristics of a process station's product output (i.e., intermediate output or final output) can be measured, for example: temperature, weight, product dimensions, mechanical, chemical, optical and/or electrical properties, number of design defects, the presence or absence of a defect type. The various characteristics that can be measured, will be referred to generally as "intermediate output value" or "final output value." The intermediate/final output value can reflect a single measured characteristic of an intermediate/final output, or an overall score based on a specified set of characteristics associated with the intermediate/final output that are measured and weighted according to a predefined formula.

Mechanical properties can include hardness, compression, tack, density and weight. Optical properties can include absorption, reflection, transmission, and refraction. Electrical properties can include electrical resistivity and conductivity. Chemical properties can include enthalpy of formation, toxicity, chemical stability in a given environment, flammability (the ability to burn), preferred oxidation states, pH (acidity/alkalinity), chemical composition, boiling point, vapor point). The disclosed mechanical, optical, chemical and electrical properties are just examples and are not intended to be limiting.

All processes generally have inherent variation even under static conditions. Each process station may vary within limits. These limits may be naturally occurring as the result of normal control algorithms such as a proportional-integral-derivative (PID) controller. Each process may also vary due to conditions external to the process station control. For example, raw materials may vary over time and affect the process. The variation in raw materials may generally limited by specifying limits of the raw material properties. For example, a plastic may be specified to have a viscosity to be within upper and lower limits of 47 to 53 cP. The effect of the variation of the raw material properties may be used in the training of an artificial intelligence model that is used for a process simulator. In another example, external conditions, such as the temperature and humidity of the factory, may vary. These inputs to an artificial intelligence model are considered universal inputs.

Process parameters may broadly refer to any characteristic or value in the manufacturing process that may be measured or observed. For example, process parameters may be characteristics of intermediate outputs or final outputs generated during the manufacturing process.

In some embodiments, the inherent variation of processes can be characterized by the limits of variation, such as those described above. For example, process parameters may be indicated by the mean and standard deviation of the parameter over time. In statistical process control terms, the capability of the process may be expressed as the parameter specification limits/process variation (e.g., process capability Cp and Cpk). In some embodiments, the inherent variation of processes can be characterized by the frequency of variation. For example, the temperature of a press being controlled may vary by +/−2 deg C. over a period of two minutes. In another example, the raw material used to feed the press may vary by +/3 cP over a period of one hour. In another example, the factory temperature/humidity may vary by +/5 deg C.; +/−10 RH over a period of twelve hours. In some embodiments, the "grand" variation may be cumulative of the range of the variation of normal variation and time dependent variation.

A future timeline of process performance may be estimated and its probability of occurring may be determined by knowing or learning the amplitude and frequency of variation for all process conditions. In some embodiments, by knowing or learning the future timeline and probability of occurrence, processing parameters may be changed to mitigate process performance variations. To evaluate the future effects of changing the processing parameters, the "new" process parameters may be supplied to the process emulator which may, in turn, change the processing characteristics as determined by the process simulator.

The present disclosure generally relates to a system and method for evaluating future effects of changing process parameters in a manufacturing system. In some embodiments, the system and method may involve the use of a process prediction model and multiple process stations, each with inherent variability. This variability may be due to a variety of factors, including but not limited to, external conditions, raw material properties, and control algorithms. The system and method may be designed to account for this variability, thereby providing a more accurate and reliable prediction of future process performance.

In some embodiments, the system may include a station controller configured to communicate bidirectionally with the process stations and the process prediction model. The station controller may send and receive parameters through bidirectional communications with each process station, while the deep learning processor may exchange parameters bidirectionally with each process station. This communication may allow for a more dynamic and responsive system, capable of adjusting to changes in process parameters in real-time.

Overall, the system and method of the present disclosure may provide a more accurate and reliable way of predicting future process performance in a manufacturing system. By accounting for inherent process variability and using deep learning techniques, the system and method may provide a more comprehensive and detailed model of the manufacturing process, leading to improved process performance and efficiency.

FIG. 1 is a block diagram illustrating a manufacturing system 100, according to example embodiments. Manufacturing system 100 may include a station controller 110. In some embodiments, station controller 110 may be representative of a PLC. In some embodiments, station controller 110 may be configured to control a single or multiple process stations or a single control value or multiple control values associated with a single or multiple process stations. As shown, station controller 110 may communicate bidirectionally with multiple process stations. For example, station controller 110 may send and receive parameters through bidirectional communications with process station 130 via communication channel 116; station controller 110 may send and receive parameters through bidirectional communications with process station 140 via communication channel 114; station controller 110 may send and receive parameters through bidirectional communications with process station 150 via communication channel 112; station controller 110 may send and receive parameters through bidirectional communications with process station 160 via communication channel 116; and station controller 110 may send and receive parameters through bidirectional communications with process station 170 via communication channel 118. Although a single station controller 110 is shown, those skilled in the art understand that multiple station controllers may be used.

As shown, process station 130 may receive input material 131. Input material 131 may be broadly representative of raw material that may be used during the manufacturing process. Exemplary raw material may include, for example, plastics, metals, rubber, and the like. Process station 130 may be configured to perform a step of the manufacturing process on input material 131. As output, process station 130 may generate output material 132. Output material 132 may then be provided, as input, to process station 170.

Process station 140 may receive input material 141. Input material 141 may be broadly representative of raw material that may be used during the manufacturing process. Exemplary raw material may include, for example, plastics, metals, rubber, and the like. Process station 140 may be configured to perform a step of the manufacturing process on input material 141. As output, process station 140 may generate output material 142. Output material 142 may then be provided, as input, to process station 160.

Process station 150 may receive input material 151. Input material 151 may be broadly representative of raw material that may be used during the manufacturing process. Exemplary raw material may include, for example, plastics, metals, rubber, and the like. Process station 150 may be configured to perform a step of the manufacturing process on input material 151. As output, process station 150 may generate output material 152. Output material 152 may then be provided, as input, to process station 170.

Process station 160 may receive, as input, output material 142 from process station 140. Process station 160 may be configured to perform a step of the manufacturing process on output material 142. As output, process station 160 may generate output material 162. Output material 162 may then be provided, as input, to process station 170.

Process station 170 may be configured to perform a step of the manufacturing process on output material 132, output material 162, and output material 152. As output, process station 170 may generate output material 172. Output material 172 may represent the final output of the manufacturing process.

As those skilled in the art understand, raw materials, by their very nature, have variability in their physical properties. Such variability, however, may not be limited to the nature of the raw materials themselves, but could be attributed to the environmental conditions of the manufacturing system 100. Due to this variability, during a manufacturing process, the variability of an article undergoing manufacture may accumulate, resulting in outputs from manufacturing system 100 that may be highly variable. To account for this, manufacturing system 100 may employ a computing system 120, which may include a process prediction model 125 for optimizing processing parameters to reduce or minimize variability in the manufacturing process. In some embodiments, process prediction model 125 may be representative of a deep learning model.

As shown, station controller 110 may also communicate bidirectionally with a computing system 120. For example, station controller 110 may be configured to exchange parameters bidirectionally with computing system 120 via channel 115. Computing system 120 may be configured to analyze outputs from any of process stations 130, 140, 150, 160, or 170. Process prediction model 175 trained on the outputs generated from the process stations 130, 140, 150, 160, 170.

Process prediction model 175 may be executed with consideration of all process station variability. In some embodiments, process prediction model 175 may be further trained using optimized parameters if the optimized parameters meet a predetermined confidence threshold.

In some embodiments, computing system 120 may collect station parameters for each of the plurality of process stations 130-170 via one or more channels 122, 124, 126, 127, and 128. Generally, the station parameters may include at least one of: setpoints, control values, intermediate output values, and other station values. In some embodiments, the process variation for each of the plurality process stations 130-170 may be characterized by the mean and standard deviation of the station parameters over time. In some embodiments, the process variation for each of the plurality of process stations 130-170 may be further characterized by the frequency of variation of the station parameters.

Figure 2:
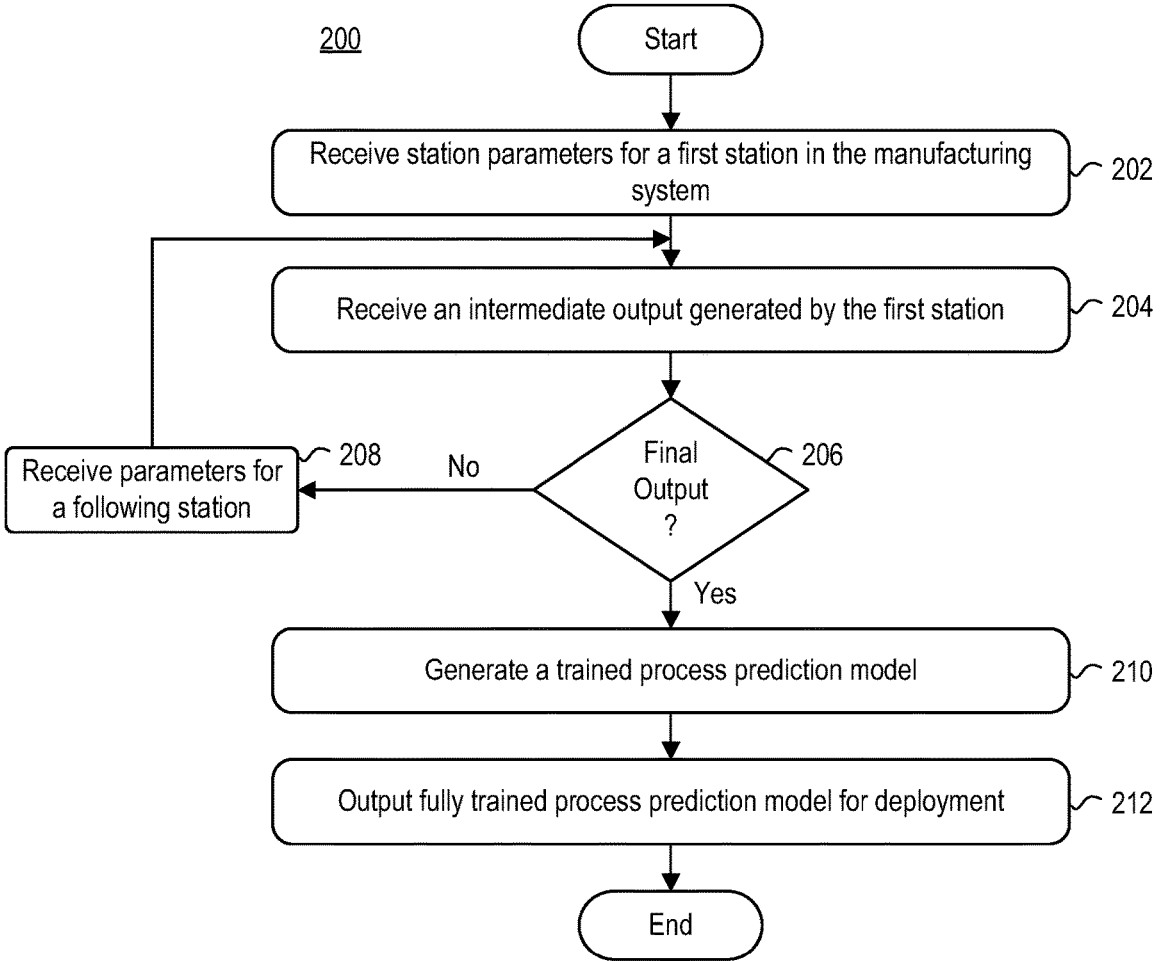
FIG. 2 is a flowchart illustrating a method for generating a prediction model to optimize process parameters in a manufacturing process, according to example embodiments.

FIG. 2 is a flowchart illustrating a method 200 for generating a process prediction model for optimizing process parameters to reduce variability in the manufacturing process, according to example embodiments. Method 200 may begin at step 202.

At step 202, computing system 120 may receive station parameters for a first station in the manufacturing system. For example, station controller 110 may communicate the station parameters of the first station to computing system 120. The station parameters may broadly refer to setpoints set by station controller 110 on the first station for performing a first step in the manufacturing process. In some embodiments, computing system 120 may further receive variability information regarding the input material to the first station.

At step 204, computing system 120 may receive an intermediate output generated by the first station. For example, the first station may perform a first step in the manufacturing process on the raw material in accordance with the setpoints communicated by station controller 110. The first station may communicate the intermediate output to computing system 120. In some embodiments, the intermediate output may include an evaluation of a variability of the intermediate output. First station may continue processing until the process variation for the process station has been fully characterized. In some embodiments, fully characterizing the process variation may involve analyzing the parameter being controlled and a corresponding final or intermediate output value.

At step 206, computing system 120 may determine whether the output received is the final output of the manufacturing process. In other words, computing system 120 may determine whether the output received is from the last step in the manufacturing process. If, at step 206, computing system 120 determines that the output is an intermediate output and not a final output, then method 200 may proceed to step 208. At step 208, station parameters for the next process station may be received. Method 200 may then revert from step 208 to step 204 for further processing.

If, however, at step 206, computing system 120 determines that the output received is the final output, then method 200 may proceed to step 210. At step 210, computing system 120 may generate a trained process prediction model based on the station parameters and corresponding output values collected in steps 202-208. For example, computing system 120 may generate a training data set that includes a plurality of example station parameters, corresponding output values, and variability information for training process prediction model to optimize the process parameters of a manufacturing process.

At step 212, computing system 120 may output a fully trained process prediction model that may be deployed in manufacturing system 100.

FIG. 3 is a flowchart illustrating a method 300 of optimizing process parameters to reduce or minimize variability in a manufacturing system, according to example embodiments. Method 300 may begin at step 302.

At step 302, computing system 120 may receive process parameters to be optimized. Using a specific example, such as in the case of additive manufacturing, an operator may provide to computing system 120 that the process parameter to be optimized is the tensile strength of each layer in the additive manufacturing process while minimizing the amount of material used. In some embodiments, an operator or user may set a hierarchy of the process parameters to be optimized. Continuing with the above example, the operator or user may define the hierarchy as first optimizing tensile strength and then optimizing the amount of material used. As those skilled in the art understand, the hierarchy may be switched. For example, an operator may instruct computing system 120 to first optimize the amount of material used and then optimize tensile strength.

At step 304, computing system 120 may initiate process prediction model 125 based on the received process parameters. For example, computing system 120 may instruct process prediction model 125 to optimize the width and thickness of each layer in the additive manufacturing process to improve tensile strength while minimizing the amount of material used in accordance with the hierarchy set by the operator.

At step 306, computing system 120 may execute process prediction model 125 to simulate the multi-step manufacturing process to optimize the one or more process parameters. For example, computing system 120 may iteratively simulate the multi-step manufacturing process using different sets of station setpoints until a set of setpoints that optimizes the one or more process parameters is identified. For example, computing system 120 may execute process prediction model 125 using a first set of process station setpoints to simulate the manufacturing process. Based on the first set of process station setpoints, process prediction model 125 may generate and evaluate the intermediate outputs generated using the first set of process station setpoints during the simulation process. Computing system 120 may continually adjust the set points input to process prediction model 125 until process prediction model 125 determines that the one or more process parameters have been optimized.

In some embodiments, one or more process parameters may be considered optimized when variability in the one or more process parameters has been reduced or minimized.

At step 308, computing system 120 may identify a first set of station set points that yielded the optimized one or more process parameters. For example, computing system 120 may identify the one or more setpoints used by process prediction model 125 that yielded an optimal balance of tensile strength and amount of material used.

At step 310, computing system 120 may instruct station controller 110 to apply the process station setpoints to the actual process stations.

Figures 4A, 4B:
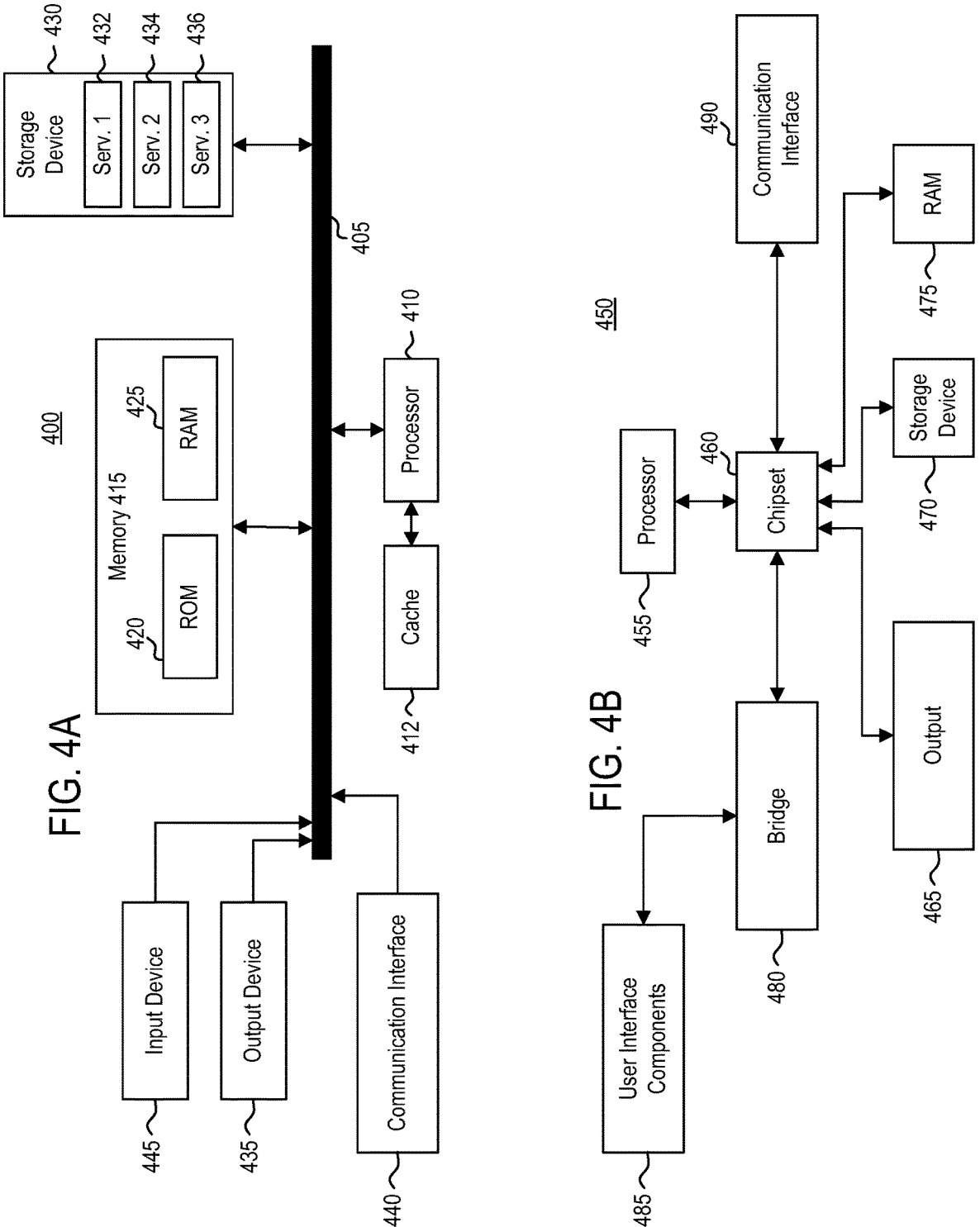
FIG. 4A is a block diagram illustrating a computing device, according to example embodiments of the present disclosure.
FIG. 4B is a block diagram illustrating a computing device, according to example embodiments of the present disclosure.

FIG. 4A illustrates a system bus architecture of computing system 400, according to example embodiments. System 400 may be representative of at least of station controller 110 or computing system 120. One or more components of system 400 may be in electrical communication with each other using a bus 405. System 400 may include a processing unit (CPU or processor) 410 and a system bus 405 that couples various system components including the system memory 415, such as read only memory (ROM) 420 and random-access memory (RAM) 425, to processor 410.

System 400 may include a cache of high-speed memory connected directly with, in close proximity to, or integrated as part of processor 410. System 400 may copy data from memory 415 and/or storage device 430 to cache 412 for quick access by processor 410. In this way, cache 412 may provide a performance boost that avoids processor 410 delays while waiting for data. These and other modules may control or be configured to control processor 410 to perform various actions. Other system memory 415 may be available for use as well. Memory 415 may include multiple different types of memory with different performance characteristics. Processor 410 may include any general-purpose processor and a hardware module or software module, such as service 1 432, service 2 434, and service 3 436 stored in storage device 430, configured to control processor 410 as well as a special-purpose processor where software instructions are incorporated into the actual processor design. Processor 410 may essentially be a completely self-contained computing system, containing multiple cores or processors, a bus, memory controller, cache, etc. A multi-core processor may be symmetric or asymmetric.

To enable user interaction with the computing system 400, an input device 445 may represent any number of input mechanisms, such as a microphone for speech, a touch-sensitive screen for gesture or graphical input, keyboard, mouse, motion input, speech and so forth. An output device 435 may also be one or more of a number of output mechanisms known to those of skill in the art. In some instances, multimodal systems may enable a user to provide multiple types of input to communicate with computing system 400. Communications interface 440 may generally govern and manage the user input and system output. There is no restriction on operating on any particular hardware arrangement and therefore the basic features here may easily be substituted for improved hardware or firmware arrangements as they are developed.

Storage device 430 may be a non-volatile memory and may be a hard disk or other types of computer readable media which may store data that are accessible by a computer, such as magnetic cassettes, flash memory cards, solid state memory devices, digital versatile disks, cartridges, random access memories (RAMs) 425, read only memory (ROM) 420, and hybrids thereof.

Storage device 430 may include services 432, 434, and 436 for controlling the processor 410. Other hardware or software modules are contemplated. Storage device 430 may be connected to system bus 405. In one aspect, a hardware module that performs a particular function may include the software component stored in a computer-readable medium in connection with the necessary hardware components, such as processor 410, bus 405, output device 435 (e.g., display), and so forth, to carry out the function.

FIG. 4B illustrates a computer system 450 having a chipset architecture that may represent at least of station controller 110 or computing system 120. Computer system 450 may be an example of computer hardware, software, and firmware that may be used to implement the disclosed technology. System 450 may include a processor 455, representative of any number of physically and/or logically distinct resources capable of executing software, firmware, and hardware configured to perform identified computations. Processor 455 may communicate with a chipset 460 that may control input to and output from processor 455.

In this example, chipset 460 outputs information to output 465, such as a display, and may read and write information to storage device 470, which may include magnetic media, and solid-state media, for example. Chipset 460 may also read data from and write data to storage device 475 (e.g., RAM). A bridge 480 for interfacing with a variety of user interface components 485 may be provided for interfacing with chipset 460. Such user interface components 485 may include a keyboard, a microphone, touch detection and processing circuitry, a pointing device, such as a mouse, and so on. In general, inputs to system 450 may come from any of a variety of sources, machine generated and/or human generated.

Chipset 460 may also interface with one or more communication interfaces 490 that may have different physical interfaces. Such communication interfaces may include interfaces for wired and wireless local area networks, for broadband wireless networks, as well as personal area networks. Some applications of the methods for generating, displaying, and using the GUI disclosed herein may include receiving ordered datasets over the physical interface or be generated by the machine itself by processor 455 analyzing data stored in storage device 470 or storage device 475. Further, the machine may receive inputs from a user through user interface components 485 and execute appropriate functions, such as browsing functions by interpreting these inputs using processor 455.

It may be appreciated that example systems 400 and 450 may have more than one processor 410 or be part of a group or cluster of computing devices networked together to provide greater processing capability.

While the foregoing is directed to embodiments described herein, other and further embodiments may be devised without departing from the basic scope thereof. For example, aspects of the present disclosure may be implemented in hardware or software or a combination of hardware and software. One embodiment described herein may be implemented as a program product for use with a computer system. The program(s) of the program product define functions of the embodiments (including the methods described herein) and may be contained on a variety of computer-readable storage media. Illustrative computer-readable storage media include, but are not limited to: (i) non-writable storage media (e.g., read-only memory (ROM) devices within a computer, such as CD-ROM disks readably by a CD-ROM drive, flash memory, ROM chips, or any type of solid-state non-volatile memory) on which information is permanently stored; and (ii) writable storage media (e.g., floppy disks within a diskette drive or hard-disk drive or any type of solid state random-access memory) on which alterable information is stored. Such computer-readable storage media, when carrying computer-readable instructions that direct the functions of the disclosed embodiments, are embodiments of the present disclosure.

It will be appreciated to those skilled in the art that the preceding examples are exemplary and not limiting. It is intended that all permutations, enhancements, equivalents, and improvements thereto are apparent to those skilled in the art upon a reading of the specification and a study of the drawings are included within the true spirit and scope of the present disclosure. It is therefore intended that the following appended claims include all such modifications, permutations, and equivalents as fall within the true spirit and scope of these teachings.

The invention claimed is:

1. A manufacturing system, comprising:
a plurality of stations, each station configured to perform at least one step in a multi-step manufacturing process for a product, each station having an inherent variability due to one or more of external conditions or control algorithms associated with the station;
a station controller communicating with the plurality of stations, the station controller defining setpoints for each of the plurality of stations; and
a computing system configured to optimize process parameters in the multi-step manufacturing process, the computing system configured to perform operations, comprising:
identifying a material for manufacturing the product, the material comprising a variability in its physical properties;
receiving one or more process parameters to be optimized during the multi-step manufacturing process;
initiating a process prediction model in accordance with the one or more process parameters to be optimized during the multi-step manufacturing process, wherein the process prediction model is a deep learning model;
optimizing the one or more process parameters of each station of the plurality of stations by simulating, using the process prediction model, the multi-step manufacturing process using a plurality of sets of different setpoints for each station until a further variability of outputs generated by each station during the simulating has been reduced or minimized, wherein the deep learning model uses the variability in the physical properties of the material as an input parameter to predict the further variability of outputs, and wherein the simulating is based on one or more of the one or more external conditions of each station or the control algorithms associated with each station;
identifying a first set of setpoints from the plurality of sets of different setpoints that optimized the one or more process parameters; and
causing the station controller to apply the first set of setpoints to the plurality of stations.

2. The manufacturing system of claim 1, simulating, using the process prediction model, the multi-step manufacturing process using the plurality of sets of different setpoints comprises:
executing a first simulation using the plurality of sets of different setpoints to achieve a first optimal process parameter; and
executing a second simulation using the plurality of sets of different setpoints to achieve a second optimal process parameter.

3. The manufacturing system of claim 2, wherein an operator defines a hierarchy between the first optimal process parameter and the second optimal process parameter.

4. The manufacturing system of claim 1, wherein the multi-step manufacturing process is an additive manufacturing process.

5. The manufacturing system of claim 4, wherein the one or more process parameters to be optimized during the multi-step manufacturing process comprises two process parameters corresponding to a width and a thickness of each layer in the additive manufacturing process.

6. The manufacturing system of claim 1, wherein the process prediction model is trained with actual outputs generated by the manufacturing system during the multi-step manufacturing process.

7. The manufacturing system of claim 1, wherein a second variability of each station of the plurality of stations is characterized by a mean and standard deviation of station parameters over time.

8. A method of optimizing process parameters in a multi-step manufacturing process, comprising:

identifying, by a computing system, a material for manufacturing a product according to the multi-step manufacturing process, the material comprising a variability in its physical properties;

receiving, by a computing system, one or more process parameters to be optimized during the multi-step manufacturing process, the multi-step manufacturing process performed in a manufacturing system comprising a plurality of stations, each station configured to perform a step in the multi-step manufacturing process, and a station controller communicating with the plurality of stations, the station controller defining setpoints for each of the plurality of stations, and each station having an inherent variability due to one or more of external conditions or control algorithms associated with the station;

initiating, by the computing system, a process prediction model in accordance with the one or more process parameters to be optimized during the multi-step manufacturing process, wherein the process prediction model is a deep learning model;

optimizing, by the computing system, the one or more process parameters of each station of the plurality of stations by simulating, using the process prediction model, the multi-step manufacturing process using a plurality of sets of different setpoints until a further variability of outputs generated by each station during the simulating has been reduced or minimized, wherein the deep learning model uses the variability in the physical properties of the material as an input parameter to predict the further variability of outputs, and wherein the simulating is based on one or more of the one or more external conditions of each station or the control algorithms associated with each station;

identifying, by the computing system, a first set of setpoints from the plurality of sets of different setpoints that optimized the one or more process parameters; and causing, by the computing system, the station controller to apply the first set of setpoints to the plurality of stations.

9. The method of claim 8, wherein simulating, by the computing system using the process prediction model, the multi-step manufacturing process using the plurality of sets of different setpoints comprises:

executing a first simulation using the plurality of sets of different setpoints to achieve a first optimal process parameter; and executing a second simulation using the plurality of sets of different setpoints to achieve a second optimal process parameter.

10. The method of claim 9, wherein an operator defines a hierarchy between the first optimal process parameter and the second optimal process parameter.

11. The method of claim 8, wherein the multi-step manufacturing process is an additive manufacturing process.

12. The method of claim 11, wherein the one or more process parameters to be optimized during the multi-step manufacturing process comprises two process parameters corresponding to a width and a thickness of each layer in the additive manufacturing process.

13. The method of claim 8, wherein the process prediction model is trained with actual outputs generated by the manufacturing system during the multi-step manufacturing process.

14. The method of claim 8, wherein a second variability of each station of the plurality of stations is characterized by a mean and standard deviation of station parameters over time.

15. A non-transitory computer readable medium comprising one or more sequences of instructions stored thereon, which, when executed by a processor, causes a computing system to perform operations comprising:

identifying, by a computing system, a material for manufacturing a product according to a multi-step manufacturing process, the material comprising a variability in its physical properties;

receiving, by the computing system, one or more process parameters to be optimized during the multi-step manufacturing process, the multi-step manufacturing process performed in a manufacturing system comprising a plurality of stations, each station configured to perform a step in the multi-step manufacturing process, and a station controller communicating with the plurality of stations, the station controller defining setpoints for each of the plurality of stations, and each station having an inherent variability due to one or more of external conditions or control algorithms associated with the station;

initiating, by the computing system, a process prediction model in accordance with the one or more process parameters to be optimized during the multi-step manufacturing process, wherein the process prediction model is a deep learning model;

simulating, by the computing system using the process prediction model, the multi-step manufacturing process using a plurality of sets of different setpoints until a further variability of outputs generated by each station during the simulating has been reduced or minimized, wherein the deep learning model uses the variability in the physical properties of the material as an input parameter to predict the further variability of outputs, and wherein the simulating is based on one or more of the one or more external conditions of each station or the control algorithms associated with each station;

identifying, by the computing system, a first set of setpoints from the plurality of sets of different setpoints that optimized the one or more process parameters; and causing, by the computing system, the station controller to apply the first set of setpoints to the plurality of stations.

16. The non-transitory computer readable medium of claim 15, wherein simulating, using the process prediction model, the multi-step manufacturing process using the plurality of sets of different setpoints comprises:

executing a first simulation using the plurality of sets of different setpoints to achieve a first optimal process parameter; and executing a second simulation using the plurality of sets of different setpoints to achieve a second optimal process parameter.

17. The non-transitory computer readable medium of claim 16, wherein an operator defines a hierarchy between the first optimal process parameter and the second optimal process parameter.

18. The non-transitory computer readable medium of claim 15, wherein the multi-step manufacturing process is an additive manufacturing process.

19. The non-transitory computer readable medium of claim 18, wherein the one or more process parameters to be optimized during the multi-step manufacturing process comprises two process parameters corresponding to a width and a thickness of each layer in the additive manufacturing process.

20. The non-transitory computer readable medium of claim 15, wherein the process prediction model is trained with actual outputs generated by the manufacturing system during the multi-step manufacturing process.

\*    \*    \*    \*    \*